(12) United States Patent
Wang

(10) Patent No.: US 12,120,932 B2
(45) Date of Patent: Oct. 15, 2024

(54) DISPLAY PANEL AND DISPLAY APPARATUS

(71) Applicant: Beijing Xiaomi Mobile Software Co., Ltd., Beijing (CN)

(72) Inventor: Yue Wang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 16 days.

(21) Appl. No.: 17/708,481

(22) Filed: Mar. 30, 2022

(65) Prior Publication Data

US 2023/0091187 A1 Mar. 23, 2023

(30) Foreign Application Priority Data

Sep. 18, 2021 (CN) .......................... 202111101584.8

(51) Int. Cl.
*H10K 59/131* (2023.01)
(52) U.S. Cl.
CPC .................................. *H10K 59/131* (2023.02)
(58) Field of Classification Search
CPC .... H10K 59/131; H10K 59/12; G02F 1/1345; G02F 1/13452; G02F 1/13454; G02F 1/13629; G02F 1/136286; G02F 1/13456; G02F 1/13458; H01L 27/3276
See application file for complete search history.

(56) References Cited

U.S. PATENT DOCUMENTS

| | | | | |
|---|---|---|---|---|
| 2019/0051670 A1* | 2/2019 | Bei | ........................ | H01L 27/124 |
| 2019/0206894 A1* | 7/2019 | Lee | ........................ | G09G 3/20 |
| 2021/0343823 A1* | 11/2021 | Tanaka | ........................ | G09F 9/30 |
| 2021/0351259 A1* | 11/2021 | Lee | ........................ | H10K 59/131 |
| 2022/0115485 A1* | 4/2022 | Yu | ........................ | H10K 59/353 |
| 2022/0271113 A1* | 8/2022 | Zhou | ........................ | G09G 3/20 |
| 2023/0053413 A1* | 2/2023 | Liu | ........................ | H10K 59/1213 |

(Continued)

FOREIGN PATENT DOCUMENTS

| CN | 106226963 A | * | 12/2016 | ....... | G02F 1/136286 |
|---|---|---|---|---|---|
| CN | 107919090 A | * | 4/2018 | ........... | G09G 3/3208 |

(Continued)

OTHER PUBLICATIONS

Extended European Search Report dated Sep. 6, 2022 for European Patent Application No. 22165503.8.

*Primary Examiner* — Ali Naraghi
*Assistant Examiner* — E. Rhett Cheek
(74) *Attorney, Agent, or Firm* — Volpe Koenig

(57) ABSTRACT

A display panel includes a display region with a thin film transistor and a plurality of data lines and a non-display region. Thin film transistor includes a gate, a source region and a drain region, data lines include a plurality of first type data lines which are located at an edge of display region and close to a side of non-display region. First type data line includes a first sub-data line extending in a first direction, a conductive connection line extending in a second direction and a second sub-data line extending in a first direction. First sub-data line is connected with source region or drain region. A first insulating layer is between conductive connection line and first sub-data line. A second insulating layer is between second sub-data line and conductive connection line, and second sub-data line is closer to a central axis of display panel than first sub-data line.

18 Claims, 3 Drawing Sheets

(56) References Cited

U.S. PATENT DOCUMENTS

2023/0157099 A1\* 5/2023 Du .................... H10K 59/1216
                                                                                     257/91
2023/0263023 A1\* 8/2023 Lee ..................... H10K 59/131
                                                                                     257/773

FOREIGN PATENT DOCUMENTS

| CN | 107919090 | B |   | 1/2020 |              |
|----|-----------|---|---|--------|--------------|
| CN | 106226963 | B | \* | 4/2021 | G02F 1/136286 |
| CN | 113130606 | A |   | 7/2021 |              |
| CN | 113363281 | A | \* | 9/2021 | G02F 1/136   |
| KR | 10-2006-0063496 | A |   | 6/2006 |        |

\* cited by examiner

DISPLAY PANEL AND DISPLAY APPARATUS

CROSS REFERENCE TO RELATED APPLICATIONS

The present application claims the benefit of priority to Chinese Patent Application No. 202111101584.8, filed on Sep. 18, 2021, the contents of which are incorporated herein by reference in their entireties for all purpose.

BACKGROUND

More and more terminal products use organic light-emitting diode (OLED) display panels, while pursuing higher-quality display effects, users have higher and higher requirements for the display form of the products, and some flagship products require extremely narrow borders, and even four-equilateral border design. At present, for products with the large quantity of data lines, the narrow border requirement cannot be met by compressing a line width/line spacing of traces in a fan-out region.

SUMMARY

The disclosure relates to the technical field of display, and relates to a display panel and a display apparatus.

An example of the disclosure provides a display panel, the display panel includes a display region and a non-display region at least partially surrounding the display region, the display region is provided with a thin film transistor and a plurality of data lines, the thin film transistor includes a gate, a source region and a drain region, the plurality of data lines include a plurality of first type data lines at an edge of the display region and close to a side of the non-display region. Each first type data line includes: a first sub-data line, extending in a first direction, and connected with the source region or the drain region of the thin film transistor; a conductive connection line, extending in a second direction and connected with the first sub-data line, a first insulating layer is between the conductive connection line and the first sub-data line and the second direction is intersected with the first direction; and a second sub-data line, extending in the first direction and connected with the conductive connection line, a second insulating layer is between the second sub-data line and the conductive connection line; and the second sub-data line is closer to a central axis of the display panel than the first sub-data line, and the central axis extends in the first direction.

The disclosure further provides a display apparatus, including a display panel, the display panel includes a display region and a non-display region at least partially surrounding the display region, the display region is provided with a thin film transistor and a plurality of data lines, the thin film transistor includes a gate, a source region and a drain region, the plurality of data lines include a plurality of first type data lines, and the plurality of first type data lines are at an edge of the display region and close to a side of the non-display region. Each first type data line includes: a first sub-data line, extending in a first direction, and connecting with the source region or the drain region of the thin film transistor; a conductive connection line, a first insulating layer is between the conductive connection line and the first sub-data line; the conductive connection line extends in a second direction and is connected with the first sub-data line, and the second direction is intersected with the first direction; and a second sub-data line, a second insulating layer is between the second sub-data line and the conductive connection line; the second sub-data line extends in the first direction and is connected with the conductive connection line, the second sub-data line is closer to a central axis of the display panel than the first sub-data line, and the central axis extends in the first direction.

DETAILED DESCRIPTION

Figure 1:
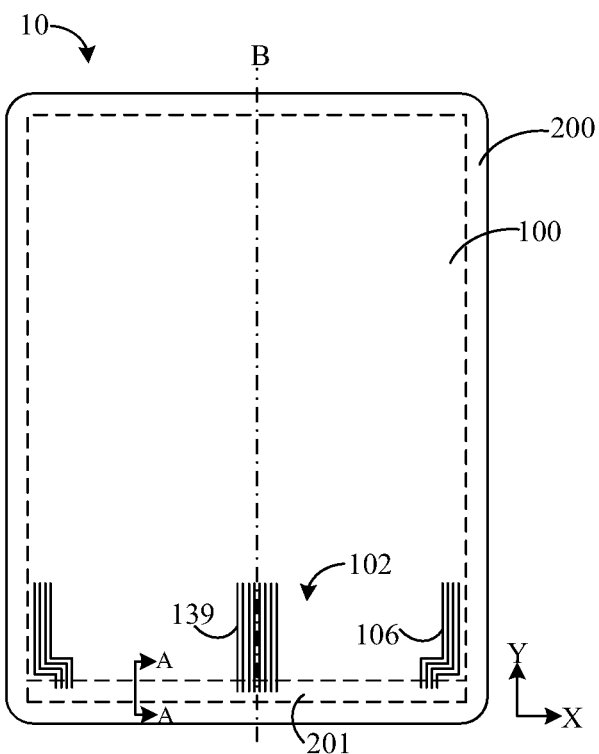
FIG. 1 is a schematic structural diagram of an example of a display panel of the disclosure.

Some embodiments will be described in detail herein, examples of which are illustrated in the accompanying drawings. When the following description refers to the accompanying drawings, same reference numbers in different drawings represent same or similar elements unless otherwise stated. The implementations described in the following examples do not represent all implementations consistent with the disclosure. On the contrary, they are merely examples of an apparatus consistent with some aspects of the disclosure as detailed in the appended claims.

The terms used in the disclosure are for the purpose of describing particular examples only and are not intended to limit the disclosure. Unless defined otherwise, technical or scientific terms used in the disclosure shall have the ordinary meaning as understood by those ordinarily skilled in the art to which the disclosure belongs. Words like "a" or "an" used in the specification and claims of the disclosure also do not denote a quantitative limitation, but rather denote the presence of at least one. "more than one" includes two, equivalent to at least two. The words "include" or "comprise", and the like, mean that an element or article that precedes the "include" or "comprise" is inclusive of the element or article listed after the "include" or "comprise" and equivalents thereof, but does not exclude other elements or articles. The words "linked" or "connected", and the like, are not limited to physical or mechanical connections, but may include electrical connections, whether direct or indirect. As used in the disclosure and the appended claims, the singular forms "a", "the" and "this" are intended to include the plural forms as well, unless the context clearly dictates otherwise. It will also be understood that the term "and/or" as used herein refers to and includes any or all possible combinations of one or more associated listed items.

The disclosure provides an improved display panel and display apparatus. The display panel includes a display region and a non-display region at least partially surrounding the display region, the display region is provided with a thin film transistor and a plurality of data lines, the thin film transistor includes a gate, a source region and a drain region, the plurality of data lines include a plurality of first type data lines, and the plurality of first type data lines are located at an edge of the display region and are disposed close to a side of the non-display region. Each first type data line includes a first sub-data line, a conductive connection line and a second sub-data line. The first sub-data line and the second sub-data line extend in a first direction, and the conductive connection line extends in a second direction. The second direction and the first direction are disposed in an intersected mode. The first sub-data line is connected with the source region or the drain region of the thin film transistor. A first insulating layer is disposed between the conductive connection line and the first sub-data line and connected with the first sub-data line. A second insulating layer is disposed between the second sub-data line and the conductive connection line and connected with the conductive connection line, the second sub-data line is closer to a central axis of the display panel than the first sub-data line, and the central axis extends in the first direction.

The conductive connection line extending in the second direction is disposed, and connected with the first sub-data line and the second sub-data line extending in the first direction. Thus, the first sub-data line at an edge of the display panel gets close to a middle of the display panel and is led out from the second sub-data line closer to the central axis of the display panel, a width of a fan-out region of the non-display region is reduced, and accordingly the narrow border requirement of the display panel is realized.

The disclosure provides the display panel and the display apparatus. The display panel and the display apparatus of the disclosure will be described in detail below with reference to the accompanying drawings. The features of examples and implementations described below may be combined with each other in a case of no conflict.

FIG. 1 is a schematic structural diagram of an example of a display panel 10 of the disclosure. As shown in FIG. 1, the display panel 10 includes the display region 100 and the non-display region 200 at least partially surrounding the display region 100. The non-display region 200 includes the fan-out region 201 located on a side of the display region 100. The fan-out region 201 is located at a position of a lower region of the display region 100.

Figure 2:
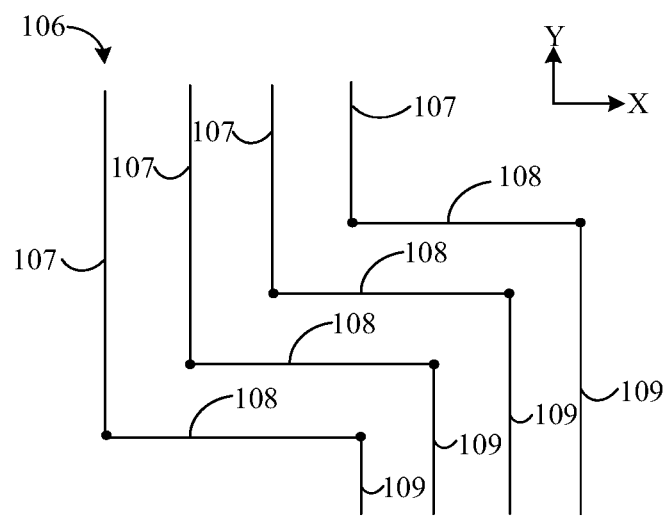
FIG. 2 is a schematic diagram of layout of first type data lines of the display panel shown in FIG. 1.
Figure 3:
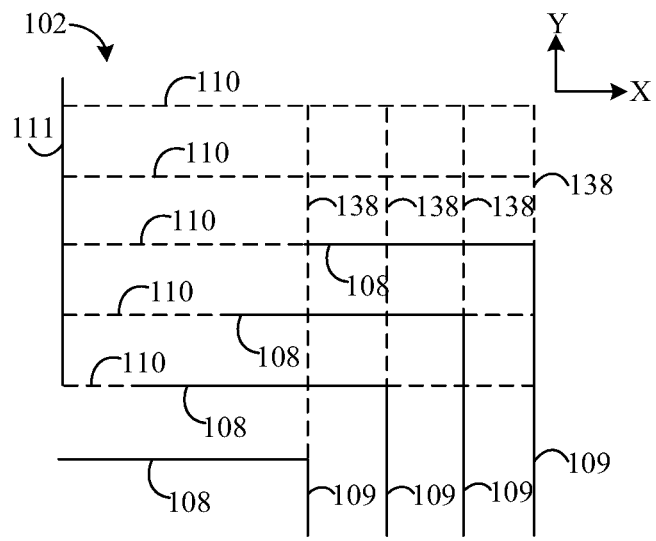
FIG. 3 is a schematic diagram of density compensation of data lines of the display panel shown in FIG. 1.
Figure 4:
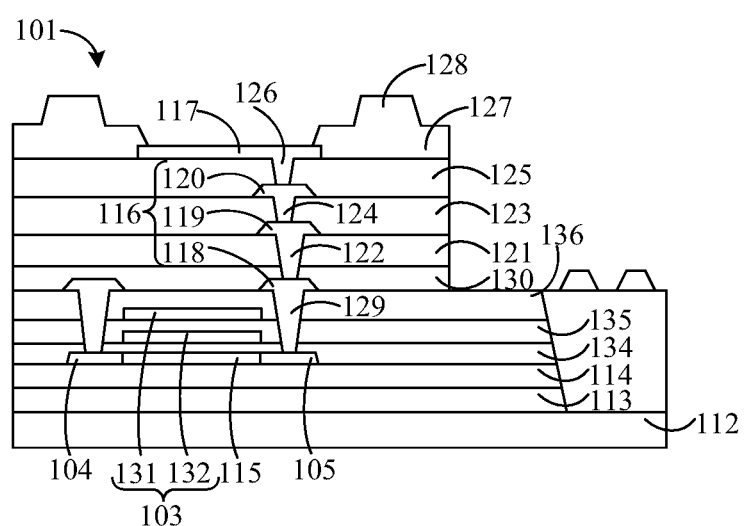
FIG. 4 is a schematic cross-sectional diagram of a direction A-A in the display panel shown in FIG. 1.
Figure 5:
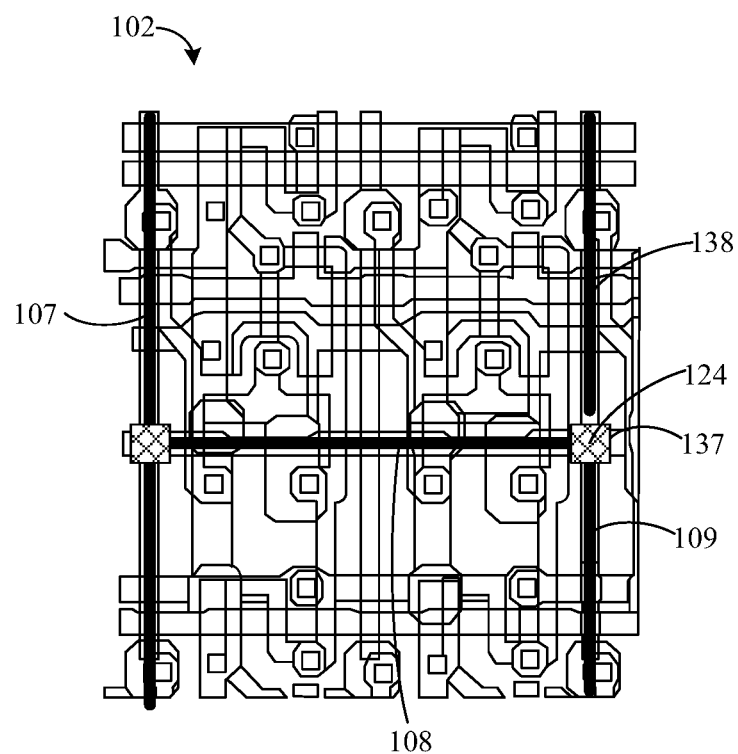
FIG. 5 is a schematic top view of the display panel shown in FIG. 1.

As shown in FIG. 1 to FIG. 5, the display region 100 is provided with a thin film transistor 101 (as shown in FIG. 4) and a plurality of data lines 102 (as shown in FIGS. 1, 3 and 5). In some examples, the thin film transistor 101 includes a gate 103, a source region 104 and a drain region 105. In some examples, the display region 100 extends in the first direction Y and the second direction X, and the first direction Y and the second direction X are disposed in an intersected mode.

In some examples, the adjacent data lines 102 of the plurality of data lines 102 are disposed in an isolated mode to avoid short circuits. The plurality of data lines 102 include a plurality of first type data lines 106. The plurality of first type data lines 106 may be data lines that provide data voltage signals. As shown in FIG. 1, the plurality of first type data lines 106 are located at the edge of the display region 100 and are disposed close to a side of the non-display region 200. The plurality of first type data lines 106 are led out from the fan-out region 201 located on one side of the display region 100.

FIG. 2 is a schematic diagram of layout of first type data lines 106 of the display panel shown in FIG. 1. As shown in FIG. 2, each first type data line 106 includes a first sub-data line 107, a conductive connection line 108 and a second sub-data line 109. Both the first sub-data lines 107 and the second sub-data lines 109 may be data lines that provide data voltage signals. The conductive connection lines 108 may be data lines that provide data voltage signals. The conductive connection lines 108 are configured to electrically connect the first sub-data lines 107 with the second sub-data lines 109.

In some examples, the first sub-data lines 107 and the second sub-data lines 109 extend in the first direction Y. The first sub-data lines 107 are connected with the source region 104 or the drain region 105 of the thin film transistor 101. As shown in FIG. 1 to FIG. 5, in a thickness direction of the display panel 10, the first sub-data lines 107 and the thin film transistor 101 are disposed on different layers. The first sub-data lines 107 are disposed on the thin film transistor 101, formed above the thin film transistor 101, and electrically connected with the source region 104 or the drain region 105 of the thin film transistor 101.

In some examples, the conductive connection lines 108 extend in the second direction X, and the conductive connection lines 108 are connected with the first sub-data lines 107. In the present example, the first direction Y may be a vertical axis direction, and the second direction X may be a horizontal axis direction. As shown in FIG. 1 to FIG. 5, in the thickness direction of the display panel 10, the conductive connection lines 108 and the first sub-data lines 107 are disposed on different layers. The conductive connection lines 108 are disposed on the first sub-data lines 107 and formed above the first sub-data lines 107. One ends of the conductive connection lines 108 are electrically connected with the first sub-data lines 107, and the other ends of the conductive connection lines 108 are electrically connected with the second sub-data lines 109.

In some examples, the second sub-data lines 109 are connected with the conductive connection lines 108, and the second sub-data lines 109 are closer to the central axis B (as shown in FIG. 1 and FIG. 2) of the display panel 10 than the first sub-data lines 107, and the central axis B extends in the first direction Y. As shown in FIG. 1 to FIG. 5, in the thickness direction of the display panel 10, the second sub-data lines 109 and the conductive connection lines 108 are disposed on different layers. The second sub-data lines 109 are disposed on the conductive connection lines 108 and located above the conductive connection lines 108. The second sub-data lines 109 and the first sub-data lines 107 are disposed on different central axes B. The second sub-data lines 109 are closer to the central axis B of the display panel 10 than the first sub-data lines 107. From this point of view, in the thickness direction of the display panel 10, the first sub-data lines 107 and the second sub-data lines 109 are disposed on different layers. The direction indicated by the thickness direction of the display panel 10 is a direction perpendicular to a plane formed by the first direction Y and the second direction X.

In the above solution, the conductive connection lines 108 extending in the second direction X are disposed and electrically connected with the first sub-data lines 107 and the second sub-data lines 109 extending in the first direction Y. Thus, the first sub-data lines 107 at the edge the display panel 10 get closer to the middle of the display panel 10 and are led out from the second sub-data lines 109 closer to the central axis B of the display panel 10, the width of the fan-out region 201 of the non-display region 200 of the display panel 10 is reduced, and accordingly the narrow border requirement of the display panel 10 is realized.

For the display panel 10 with a plurality of the data lines 102, by using a layout mode of the above examples, short circuits are not prone to being generated and the display effect is not affected, the narrow border requirement of the display panel 10 can be met, and the application range is wider. In some examples, the display panel 10 may be an organic light-emitting diode display panel. In some other examples, the display panel 10 may be a high-definition screen with a plurality of data lines.

In the example shown in FIG. 2, the plurality of first sub-data lines 107 and the plurality of second sub-data lines 109 are disposed in the display region 100 at intervals. In some examples, the plurality of first sub-data lines 107 are disposed at intervals in the second direction X and the plurality of second sub-data lines 109 are disposed at intervals in the second direction X, and the plurality of conductive connection lines 108 are disposed at intervals in the first direction Y. In this way, mutual interference between the adjacent first sub-data lines 107, between the adjacent second sub-data lines 109 and between the adjacent conductive connection lines 108 is avoided.

In some examples, in the first direction Y, the conductive connection line 108 connecting the first sub-data line 107 and the second sub-data line 109 which are disposed on the outermost side of the display panel 10 is closer to the non-display region 200 of the display panel 10. In the present example, in the first direction Y, the conductive connection line 108 connecting the outermost first sub-data line 107 and second sub-data line 109 is located in a region of the display region 100 of the display panel 10 closest to the non-display region 200. The above outermost side refers to a side closest to the non-display region 200. In this way, the first sub-data line 107 located on the outermost side gets closer to a central region of the display panel 10. Thus, the width of the fan-out region 201 of the non-display region 200 of the display panel 10 is reduced, and the narrow border requirement of the display panel 10 is realized.

In some examples, the plurality of first sub-data lines 107 and the plurality of second sub-data lines 109 are at intervals in a direction toward the central axis B of the display panel 10. In the second direction X, the first sub-data lines 107 and the second sub-data lines 109 connected with the same conductive connection lines 108 get close to the central axis B of the display panel 10. Here, it shows that the plurality of first sub-data lines 107 and the plurality of second sub-data lines 109 get close from the non-display region 200 to the central axis B of the display region 100. In the present example, in the second direction X, the first sub-data lines 107 and the second sub-data lines 109 connected to the same conductive connection lines 108 synchronously get close to the central axis B of the display panel 10.

In the example shown in FIG. 2, in the second direction X, spacing distances between the adjacent first sub-data lines 107 are equal, and spacing distances between the adjacent second sub-data lines 109 are equal. In the first direction Y, lengths of the adjacent conductive connection lines 108 are equal. However, it is not limited in the disclosure.

In some examples, at least parts of the first sub-data lines 107 and the second sub-data lines 109 connected to different conductive connection lines 108 correspond to each other in position in the thickness direction of the display panel 10, i.e., the projections of at least parts of the first sub-data lines 107 and the second sub-data lines 109 connected to different conductive connection lines 108 are overlapped in the thickness direction. Since the first sub-data lines 107 and the second sub-data lines 109 are located on different layers, during layout of the plurality of data lines 102 of the display panel 10, the first sub-data line 107 on the outermost side of the display panel 10 corresponds to the second sub-data line 109 on the outermost side of the display panel 10 in position in the thickness direction of the display panel 10. The outermost side described above refers to the side closest to the non-display region 200. In this way, when the space between two layers is large enough to overcome interference between the data lines, the lines can be arranged in corresponding to each other in position in the thickness direction, thus, the layout space of the display panel 10 is effectively utilized, and the influence on other circuits is reduced as much as possible.

Due to different arrangement positions of the thin film transistor 101 in the display panel 10, although the layout shapes are similar, the degree (angle) of bending may be the same or different, and the layout may be carried out according to the actual situation, which is not limited herein.

In the example shown in FIG. 2, a degree of bending between the first sub-data lines 107 and the conductive connection lines 108 is the same as a degree of bending between the conductive connection lines 108 and the second sub-data lines 109. The degree of bending here may be expressed by an angle of bending, but not limited thereto. The first sub-data lines 107, the conductive connection lines 108 and the second sub-data lines 109 are switched by layer skip, and in order to illustrate moving from the edge of the display panel 10 to the middle of the display panel 10, only marked black points are used as turning points to represent layer skip switching, which is not repeated herein.

FIG. 3 is a schematic diagram of density compensation of data lines of the display panel shown in FIG. 1. As shown in FIG. 3, the display region 100 is further provided with a plurality of first virtual data lines 110, the first virtual data lines 110 can be configured as a dummy pattern. By disposing the plurality of first virtual data lines 110, the reflectivity problem caused by the difference in metal density can be solved. In some examples, the plurality of first virtual data lines 110 and the plurality of data lines 102 are disposed in an isolated mode. In the present example, the plurality of first virtual data lines 110 and the conductive connection lines 108 are disposed in an isolated mode so as to ensure that the conductive connection lines 108 are not disturbed. In the example shown in FIG. 3, the first virtual data lines 110 are represented by dotted lines, the purpose of which is to compensate the metal density, and there is no electrical connection relation.

In some examples, the plurality of first virtual data lines 110 extend in the second direction X, and the plurality of first virtual data lines 110 and the plurality of conductive connection lines 108 are disposed on the same layer and correspondingly connected into the same line. The plurality of first virtual data lines 110 and the plurality of conductive connection lines 108 are disposed on the same layer in the layout process. The first virtual data lines 110 are configured to compensate the reflectivity difference caused by the difference in metal density of the added plurality of conductive connection lines 108. In some examples, the display region 100 is further provided with a power bus 111 which is disposed on the thin film transistor 101 and located at an edge region of the display region 100, and the plurality of first virtual data lines 110 are connected with the power bus 111.

In some examples, the display region 100 is further provided with a plurality of second virtual data lines 138, and the plurality of second virtual data lines 138 and the plurality of second sub-data lines 109 are disposed in an isolated mode. The plurality of second virtual data lines 138 extend in the first direction Y, and the plurality of second virtual data lines 138 and the plurality of second sub-data lines 109 are disposed on the same layer and correspondingly connected into the same line.

The conductive connection line 108 connects with one end of the second sub-data line 109, the other end of the second sub-data line 109 is led out from the fan-out region 201, and data lines at the part originally connected with the second sub-data lines 109 are disconnected. Thus, the entire circuit is disconnected to avoid short circuits. The disconnected part is the second virtual data lines 138 (as shown in FIG. 5), which may perform metal density compensation for the second sub-data lines 109 in the first direction Y. Therefore, the second sub-data lines 109 do not need to perform metal density compensation in the first direction Y, nor does it need to consider the reflectivity problem caused by the difference in metal density. Therefore, in a fabrication process, it is not necessary to perform metal density compensation in the first direction Y, and it is also unnecessary to consider the reflectivity problem caused by the difference in metal density.

FIG. 4 is a schematic cross-sectional diagram of a direction A-A in the display panel shown in FIG. 1. As shown in FIG. 4, one side of the thin film transistor 101 is represented as the source region 104 (the left side), and the other side is represented as the drain region 105 (the right side), but not limited thereto. In some examples, the thin film transistor 101 further includes a substrate 112, a barrier layer 113, a buffer layer 114 and an active layer 115 which are disposed at the bottoms of the gate 103, the source region 104 and the drain region 105 and are sequentially stacked from bottom to top. The substrate 112 may be a double-layer flexible substrate. In some examples, the flexible substrate may be polyimide (PI). Polyimide may achieve better heat resistance and stability. In some examples, the barrier layer 113 and the buffer layer 114 may block the penetration of foreign matters or moisture into the active layer 115. In some examples, an active region is formed on the active layer 115, and the active region is configured to prepare the gate 103, the source region 104 and the drain region 105.

In some examples, the display region 100 is further provided with an anode 117 and at least three conductive layers 116. The conductive layers 116 may be metal layers and are configured to arrange the plurality of data lines 102. In some examples, the at least three conductive layers 116 are disposed on the thin film transistor 101, the anode 117 is disposed on the at least three conductive layers 116, and the anode 117 is connected with the drain region 105 or the source region 104 of the thin film transistor 101 through the conductive layers 116. In the present example, the anode 117 is electrically connected with the source region 104 or the drain region 105 of the thin film transistor 101 through the conductive layers 116. In some examples, the display region 100 is further provided with a cathode (not shown in figure), and the cathode is disposed on the at least three conductive layers 116 and is connected with the drain region 105 or the source region 104 of the thin film transistor 101 through the conductive layers 116.

In some examples, the at least three conductive layers 116 include a first conductive layer 118, a second conductive layer 119, and a third conductive layer 120 disposed in a stacked mode. The first conductive layer 118, the second conductive layer 119 and the third conductive layer 120 disposed in the stacked mode are disposed in an isolated mode so as to avoid short circuits caused by mutual conduction. In the present example, the first conductive layer 118, the second conductive layer 119 and the third conductive layer 120 are sequentially disposed in the stacked mode from bottom to top.

FIG. 5 is a schematic top view of the display panel shown in FIG. 1. As shown in FIG. 4 and FIG. 5, the first sub-data line 107 and the first conductive layer 118 are disposed on the same layer, and a layout process of the first sub-data line 107 and a layout process of the first conductive layer 118 are completed in the same process step. In some examples, the conductive connection line 108 and the second conductive layer 119 are disposed on the same layer, and a layout process of the conductive connection line 108 and a layout process of the second conductive layer 119 are completed in the same process step. In some examples, the second sub-data line 109 and the third conductive layer 120 are disposed on the same layer, and a layout process of the second sub-data line 109 and a wiring layout of the third conductive layer 120 are completed in the same process step.

In this way, the first sub-data line 107 on the same layer as the first conductive layer 118 is located at the bottommost layer relative to the conductive connection line 108 and the second sub-data line 109, and is located in the most edge region of the display region 100. The conductive connection line 108 on the same layer as the second conductive layer 119 is connected through layer skip, the conductive connection line 108 extends in the second direction X, gets close to the middle region from the edge region of the display region 100, and is connected to the second sub-data line 109 on the same layer as the third conductive layer 120 through layer skip, and the other end of the second sub-data line 109 is led out from the fan-out region 201.

Since from the sectional diagram shown in FIG. 5, the metal layers disposed on the conductive connection line 108 and the second sub-data line 109 cannot be seen, the conductive connection line 108 and the visible second conductive layer 119 are disposed on the same layer and completed in the same process step. The second sub-data line 109 and the visible third conductive layer 120 are disposed on the same layer and completed in the same process step. Therefore, the first sub-data line 107, the conductive connection line 108, and the second sub-data line 109 are disposed on different layers to be expressed through the above expression mode. In this way, the width of the fan-out region 201 of the non-display region 200 of the display panel 10 is reduced, and accordingly the narrow border requirement of the display panel 10 is realized.

In some examples and in referring back to FIG. 4, a first insulating layer 121 is disposed between the first conductive layer 118 and the second conductive layer 119. That is to say, the first insulating layer 121 is disposed between the first sub-data line 107 and the conductive connection line 108, the first insulating layer 121 is internally provided with a first contact hole 122, and the first sub-data line 107 and the conductive connection line 108 are connected through the first contact hole 122. In the example shown in FIG. 4, the first contact hole 122 is configured to realize the electrical connection between the first conductive layer 118 and the second conductive layer 119 as well as between the first sub-data line 107 and the conductive connection line 108. In some examples, the first insulating layer 121 may be an organic insulating layer, is configured to protect the first contact hole 122, and is located on a surface of the first conductive layer 118 for protecting the first conductive layer 118.

In some examples, a second insulating layer 123 is disposed between the second conductive layer 119 and the third conductive layer 120. That is to say, the second insulating layer 123 is disposed between the conductive connection line 108 and the second sub-data line 109, the second insulating layer 123 is internally provided with a second contact hole 124, and the conductive connection line 108 and the second sub-data line 109 are connected through the second contact hole 124. In the example shown in FIG. 4, the second contact hole 124 is configured to realize the electrical connection between the second conductive layer 119 and the third conductive layer 120 as well as between the conductive connection line 108 and the second sub-data line 109. In some examples, the second insulating layer 123 may be an organic insulating layer, and the organic insulating layer has an excellent insulating effect. From this point of view, the first insulating layer 121 and the second insulating layer 123 are disposed between the first sub-data line 107 and the second sub-data line 109, and the two thick insulating layers make the capacitance between them small, and signal crosstalk between the first sub-data line 107 and the second sub-data line 109 can be minimized.

In some examples, a third insulating layer 125 is disposed between the third conductive layer 120 and the anode 117. In some examples, the third insulating layer 125 is an organic insulating layer, and the organic insulating layer has an excellent insulating effect. In some examples, the third insulating layer 125 is internally provided with a third contact hole 126 which is configured to electrically connect the anode 117 with the third conductive layer 120. In some examples, the display region 100 is further provided with a pixel definition layer 127 and a support column 128 which are located on the same side as the anode 117 and located on both sides of the anode 117. The pixel definition layer 127 is configured to make spacers, and the main purpose is to prevent the situation that a fine metal mask makes direct contact with pixels when a luminescent material is evaporated, resulting in pixel scratches to generate defects.

In some examples, fourth contact holes 129 are disposed between the first conductive layer 118 and the source region 104 as well as between the first conductive layer 118 and the drain region 105, and the fourth contact hole 129 is configured to realize the electrical connection of the first conductive layer 118 and the source region 104 or the drain region 105. In some examples, a passivation layer 130 is disposed on the surface of the first conductive layer 118 and configured to protect the first conductive layer 118 from being oxidized, thus slowing down a corrosion rate of the first conductive layer 118.

In some examples, the active layer 115 further includes a first gate layer 131 and a second gate layer 132 which are disposed in a stacked mode from top to bottom, and a gate insulating layer 134 is disposed between the first gate layer 131 and the buffer layer 114 and disposed on the surface of the gate 103 to protect the gate 103. A capacitive insulating layer 135 is disposed between the first gate layer 131 and the second gate layer 132 to play an isolation function and avoid capacitive signal interference between the first gate layer 131 and the second gate layer 132. An interlayer insulating layer 136 is disposed between the second gate layer 132 and the first conductive layer 118. The interlayer insulating layer 136 plays an isolation function to avoid the short circuits between conductive lines between the second gate layer 132 and the first conductive layer 118. Thus, a device has better stability and reliability, thus improving the performance of the device.

In the example shown in FIG. 5, the display region 100 is further provided with a light-emitting control line (EM) 137, and the light-emitting control line 137 is configured to control a light-emitting duration of a light-emitting device. In some examples, the light-emitting control line 137 extends in the second direction X, the light-emitting control line 137 and the gate 103 of the thin film transistor 101 are disposed on the same layer, and the conductive connection line 108 is disposed corresponding to the light-emitting control line 137 in position in the thickness direction of the display panel 10. Since a pixel space of the display panel 10 is limited, there is no extra layout space for the conductive connection line 108 to be individually routed. Therefore, the conductive connection line 108 is routed horizontally to be stacked on the light-emitting control line 137 for layout. The light-emitting control line 137 and the gate 103 are disposed on the same layer, and a plurality of insulating layers are disposed between the light-emitting control line 137 and the second conductive layer 119 of the conductive connection line 108, which correspond to each other in position in the thickness direction of the display panel 10. There is no electrical connection relation between the light-emitting control line 137 with the conductive connection line 108, neither overlapping nor multiplexing. In order to minimize the influence of the conductive connection line 108 on other circuits as much as possible, traces of the conductive connection line 108 are stacked on the light-emitting control line 137.

In some examples, the plurality of data lines 102 further include a plurality of second type data lines 139 disposed on the thin film transistor 101, and the plurality of second type data lines 139 are closer to the central axis B of the display panel 10 than the first type data lines 106. The second type data lines 139 may be data lines that provide data voltage signals, and together with the first type data lines 106 realize signal transmission of the display panel 10. Since there are many first type data lines 106 and second type data lines 139 in the display panel 10, in the example shown in FIG. 1, only some of the data lines 102 are shown for illustration, but not limited thereto. The second type data lines 139 may not use the layout mode of the first type data lines 106. On the premise of meeting the narrow border requirement, a set region range of the first type data lines 106 may be set according to actual needs, which is not limited in the disclosure.

Figure 6:
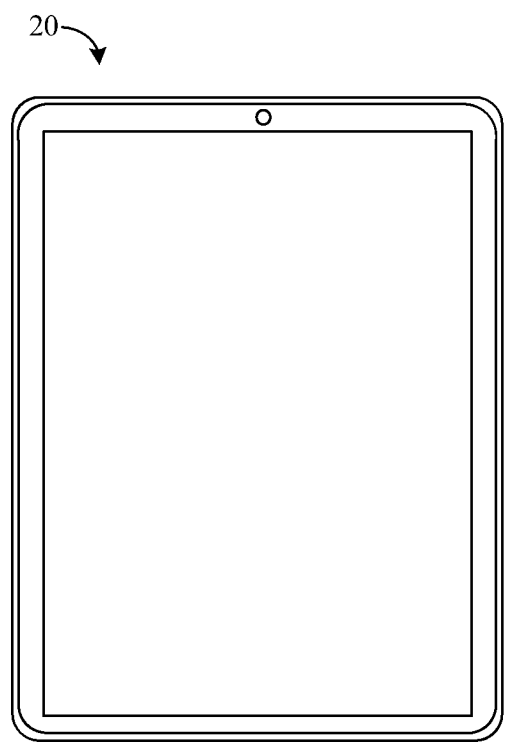
FIG. 6 is a schematic structural diagram of an example of a display apparatus of the disclosure.

An example of the disclosure further provides a display apparatus 20. FIG. 6 is a schematic structural diagram of an example of a display apparatus of the disclosure. The display apparatus 20 may be electronic equipment with a display function, such as a mobile phone, a computer, and a tablet computer. The display apparatus 20 may be a case where the display apparatus 20 is a mobile phone only schematically shown in FIG. 6. The display apparatus 20 provided by the example of the disclosure includes the display panel 10 provided by any of the examples shown in FIG. 1 to FIG. 5 of the disclosure, and thus has the corresponding structure and beneficial effects of the display panel 10, which will not be repeated herein.

The above is only the preferred examples of the disclosure, and is not intended to limit the disclosure, and all within the spirit and principle of the disclosure, any made modifications, equivalent replacements, improvements, etc., should be included within the protection scope of the disclosure.

Embodiments

A first embodiment includes a display panel, including a display region and a non-display region at least partially surrounding the display region, the display region is provided with a thin film transistor and more than one data lines, where the thin film transistor includes a gate, a source region and a drain region, the more than one data lines include more than one first type data lines, and the more than one first type data lines are at an edge of the display region and close to a side of the non-display region. The first type data line includes: a first sub-data line, extending in a first direction, and connecting with the source region or the drain region of the thin film transistor; a conductive connection line, a first insulating layer is between the conductive connection line and the first sub-data line; the conductive connection line extends in a second direction and is connected with the first sub-data line, and the second direction is intersected with the first direction; and a second sub-data line, a second insulating layer is between the second sub-data line and the conductive connection line; the second sub-data line extends in the first direction and is connected with the conductive connection line, the second sub-data line is closer to a central axis of the display panel than the first sub-data line, and the central axis extends in the first direction.

A second embodiment includes the display panel of embodiment 1, where the more than one first sub-data lines are at intervals in the second direction and the more than one second sub-data lines are at intervals in the second direction; and the more than one conductive connection lines are at intervals in the first direction.

A third embodiment includes the display panel of embodiments 1 and 2, where the more than one first sub-data line and the more than one second sub-data line are at intervals in a direction toward the central axis of the display panel.

A fourth embodiment includes the display panel of embodiments 1 to 3, where in the first direction, lengths of adjacent conductive connection lines are equal.

A fifth embodiment includes the display panel of embodiments 1 to 4, where in the first direction, spacing distances between adjacent conductive connection lines are equal.

A sixth embodiment includes the display panel of embodiments 1 to 5, where in the second direction, spacing distances between adjacent first sub-data lines are equal, and spacing distances between adjacent second sub-data lines are equal.

A seventh embodiment includes the display panel of embodiments 1 to 6, where at least parts of the first sub-data lines and the second sub-data lines connected to the different conductive connection lines correspond in position in a thickness direction of the display panel.

An eighth embodiment includes the display panel of embodiments 1 to 7, where the display region is further provided with more than one first virtual data lines isolated from the conductive connection lines; the more than one first virtual data lines extend in the second direction, and the more than one first virtual data lines and the more than one conductive connection lines are on the same layer and correspondingly connected into the same line.

A ninth embodiment includes the display panel of embodiment 8, where the display region is further provided with a power bus on the thin film transistor and at an edge region of the display region, the more than one first virtual data lines are connected with the power bus.

A tenth embodiment includes the display panel of embodiments 8 and 9, where the display region is further provided with more than one second virtual data lines isolated from the more than one second sub-data lines; the more than one second virtual data lines extend in the first direction, and the more than one second virtual data lines and the more than one second sub-data lines are on the same layer and correspondingly connected into the same line.

An eleventh embodiment includes the display panel of embodiments 1 to 10, where the display region is further provided with at least three conductive layers on the thin film transistor and an anode on the at least three conductive layers, the anode is connected with the drain region or the source region of the thin film transistor through the conductive layers; where the at least three conductive layers include a first conductive layer, a second conductive layer and a third conductive layer in a stack, the first sub-data line and the first conductive layer being on the same layer, the conductive connection line and the second conductive layer being on the same layer, and the second sub-data line and the third conductive layer being on the same layer.

A twelfth embodiment includes the display panel of embodiments 1 to 11, where the more than one data lines further include more than one second type data lines on the thin film transistor, and the more than one second type data lines are closer to the central axis of the display panel than the first type data lines.

A thirteenth embodiment includes the display panel of embodiments 1 to 12, where the display region is further provided with a light-emitting control line extending in the second direction and on the same layer with the gate of the thin film transistor, and a position of the conductive connection line corresponds to a position of the light-emitting control line in a thickness direction of the display panel.

A fourteenth embodiment includes the display panel of embodiments 1 to 13, where the first insulating layer is provided with a first contact hole, and the first sub-data line is connected with the conductive connection line through the first contact hole; the second insulating layer is provided with a second contact hole, and the conductive connection line is connected with the second sub-data line through the second contact hole.

A fifteenth embodiment includes a display apparatus, including a display panel, the display panel include a display region and a non-display region at least partially surrounding the display region, the display region is provided with a thin film transistor and more than one data lines, where the thin film transistor includes a gate, a source region and a drain region, the more than one data lines include more than one first type data lines, and the more than one first type data lines are at an edge of the display region and close to a side of the non-display region. The first type data line includes: a first sub-data line, extending in a first direction, and connecting with the source region or the drain region of the thin film transistor; a conductive connection line, a first insulating layer is between the conductive connection line and the first sub-data line; the conductive connection line extends in a second direction and is connected with the first sub-data line, and the second direction is intersected with the first direction; and a second sub-data line, a second insulating layer is between the second sub-data line and the conductive connection line; the second sub-data line extends in the first direction and is connected with the conductive connection line, the second sub-data line is closer to a central axis of the display panel than the first sub-data line, and the central axis extends in the first direction.

What is claimed is:
1. A display panel, comprising a display region and a non-display region at least partially surrounding the display region, wherein the display region is provided with a thin film transistor and more than one data lines, wherein the thin film transistor comprises a gate, a source region and a drain region, and the more than one data lines comprise more than one first type data lines, wherein the more than one first type data lines are at an edge of the display region and close to a side of the non-display region, wherein
  each of the more than one first type data lines comprise:
    a first sub-data line at the display region, extending in a first direction and connected with the source region or the drain region of the thin film transistor;

a conductive connection line at the display region, extending in a second direction and connected with the first sub-data line, wherein a first insulating layer is between the conductive connection line and the first sub-data line and the second direction is intersected with the first direction; and a second sub-data line, extending from the display region to the non-display region in the first direction and connected with the conductive connection line, wherein a second insulating layer is between the second sub-data line and the conductive connection line, and the second sub-data line is closer to a central axis of the display panel than the first sub-data line, wherein the central axis extends in the first direction, wherein, in a thickness direction of the display panel, the first sub-data lines and the second sub-data lines are on different layers, at least parts of the first sub-data lines and the second sub-data lines connected to the different conductive connection lines correspond in position in a thickness direction of the display panel, the display region is further provided with a light-emitting control line extending in the second direction and on a same layer with the gate of the thin film transistor, wherein a position of the conductive connection line corresponds to a position of the light-emitting control line in a thickness direction of the display panel.

2. The display panel according to claim 1, wherein the more than one first sub-data lines are at intervals in the second direction and the more than one second sub-data lines are at intervals in the second direction; and the more than one conductive connection lines are at intervals in the first direction.

3. The display panel according to claim 2, wherein the more than one first sub-data line and the more than one second sub-data line are at intervals in a direction toward the central axis of the display panel.

4. The display panel according to claim 2, wherein in the first direction, lengths of adjacent conductive connection lines are equal.

5. The display panel according to claim 4, wherein in the first direction, spacing distances between adjacent conductive connection lines are equal.

6. The display panel according to claim 5, wherein in the second direction, spacing distances between adjacent first sub-data lines are equal, and spacing distances between adjacent second sub-data lines are equal.

7. The display panel according to claim 4, wherein in the second direction, spacing distances between adjacent first sub-data lines are equal, and spacing distances between adjacent second sub-data lines are equal.

8. The display panel according to claim 2, wherein in the first direction, spacing distances between adjacent conductive connection lines are equal.

9. The display panel according to claim 2, wherein in the second direction, spacing distances between adjacent first sub-data lines are equal, and spacing distances between adjacent second sub-data lines are equal.

10. The display panel according to claim 1, wherein the display region is further provided with more than one first virtual data lines isolated from the conductive connection lines, wherein the more than one first virtual data lines extend in the second direction, and the more than one first virtual data lines and the more than one conductive connection lines are on a same layer and correspondingly connected into a same first line.

11. The display panel according to claim 10, wherein the display region is further provided with a power bus on the thin film transistor and at an edge region of the display region, wherein the more than one first virtual data lines are connected with the power bus.

12. The display panel according to claim 10, wherein the display region is further provided with more than one second virtual data lines isolated from the more than one second sub-data lines, wherein the more than one second virtual data lines extend in the first direction, and the more than one second virtual data lines and the more than one second sub-data lines are on a same layer and correspondingly connected into a same second line.

13. The display panel according to claim 1, wherein the display region is further provided with at least three conductive layers on the thin film transistor and an anode on the at least three conductive layers, wherein the anode is connected with the drain region or the source region of the thin film transistor through the conductive layers, wherein the at least three conductive layers comprise a first conductive layer, a second conductive layer and a third conductive layer in a stack, the first sub-data line and the first conductive layer being on a same layer, the conductive connection line and the second conductive layer being on a same layer, and the second sub-data line and the third conductive layer being on a same layer.

14. The display panel according to claim 1, wherein the more than one data lines further comprise more than one second type data lines on the thin film transistor, wherein the more than one second type data lines are closer to the central axis of the display panel than the more than one first type data lines.

15. The display panel according to claim 1, wherein the first insulating layer is provided with a first contact hole whereby the first sub-data line is connected with the conductive connection line, and the second insulating layer is provided with a second contact hole whereby the conductive connection line is connected with the second sub-data line.

16. A display apparatus, comprising a display panel, wherein the display panel comprises a display region and a non-display region at least partially surrounding the display region, the display region is provided with a thin film transistor and more than one data lines, wherein the thin film transistor comprises a gate, a source region and a drain region, the more than one data lines comprise more than one first type data lines, and the more than one first type data lines are at an edge of the display region and close to a side of the non-display region; and each of the more than one first type data lines comprise:
a first sub-data line at the display region, extending in a first direction, and connecting with the source region or the drain region of the thin film transistor;
a conductive connection line at the display region, a first insulating layer is between the conductive connection line and the first sub-data line; the conductive connection line extends in a second direction and is connected with the first sub-data line, and the second direction is intersected with the first direction; and
a second sub-data line, a second insulating layer is between the second sub-data line and the conductive connection line; the second sub-data line extends from the display region to the non-display region in the first direction and is connected with the conductive connection line, the second sub-data line is closer to a central axis of the display panel than the first sub-data line, and the central axis extends in the first direction, wherein, in a thickness direction of the display panel, the first sub-data lines and the second sub-data lines are on different layers, at least parts of the first sub-data lines and the second sub-data lines connected to the different conductive connection lines correspond in position in a thickness direction of the display panel, the display region is further provided with a light-emitting control line extending in the second direction and on a same layer with the gate of the thin film transistor, wherein a position of the conductive connection line corresponds to a position of the light-emitting control line in a thickness direction of the display panel.

17. The display panel according to claim 16, wherein the more than one first sub-data lines are at intervals in the second direction and the more than one second sub-data lines are at intervals in the second direction; and the more than one conductive connection lines are at intervals in the first direction.

18. The display panel according to claim 17, wherein the more than one first sub-data line and the more than one second sub-data line are at intervals in a direction toward the central axis of the display panel.

* * * * *